United States Patent
Dalton et al.

(10) Patent No.: US 6,278,147 B1
(45) Date of Patent: Aug. 21, 2001

(54) ON-CHIP DECOUPLING CAPACITOR WITH BOTTOM HARDMASK

(75) Inventors: Timothy J. Dalton, Ridgefield, CT (US); Andrew P. Cowley, Wappingers Falls, NY (US); Peter A. Emmi, Hyde Park, NY (US); Erdem Kaltalioglu, Wappingers Falls, NY (US); Vincent J. McGahay, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/484,359

(22) Filed: Jan. 18, 2000

(51) Int. Cl.[7] ............................ H01L 29/76; H01L 29/94; H01L 31/062; H01L 31/113; H01L 31/119

(52) U.S. Cl. ..................... 257/295; 257/303; 257/306; 257/310

(58) Field of Search ......................... 257/295, 303, 257/306, 310, 532; 438/3, 253, 396, 240

(56) References Cited

U.S. PATENT DOCUMENTS

| | | |
|---|---|---|
| 3,969,197 | 7/1976 | Tolar et al. ........................ 204/192.2 |
| 4,002,545 | 1/1977 | Fehiner et al. ..................... 204/192.2 |
| 4,423,087 | 12/1983 | Howard et al. ........................ 257/295 |
| 4,471,405 | 9/1984 | Howard et al. ........................ 257/535 |
| 5,872,697 | 2/1999 | Christensen et al. ................ 257/528 |
| 6,043,526 | * 3/2000 | Ochiai ................................... 257/295 |
| 6,180,447 | * 1/2001 | Park et al. ............................ 438/240 |
| 6,207,465 | * 3/2001 | Cuchiaro et al. ........................ 438/3 |
| 6,207,528 | * 3/2001 | Lee ...................................... 438/398 |

* cited by examiner

Primary Examiner—Olik Chaudhuri
Assistant Examiner—Hoai Pham
(74) Attorney, Agent, or Firm—Ratner & Prestia; H. Daniel Schnurmann, Pat. Agent

(57) ABSTRACT

An on-chip vertically stacked decoupling capacitor includes a hardmask film formed between the capacitor dielectric and the lower electrode. The manufacturing process used to form the capacitor takes advantage of the hardmask film and enables the capacitor to be formed over a low-k dielectric material. Attack of the underlying low-k dielectric material is suppressed during the etching and stripping processes used to form the capacitor, due to the presence of the hardmask. The low-k dielectric film provides for a reduced parasitic capacitance between adjacent conductive wires formed in the low-k dielectric material and therefore provides for increased levels of integration.

6 Claims, 4 Drawing Sheets

ON-CHIP DECOUPLING CAPACITOR WITH BOTTOM HARDMASK

FIELD OF THE INVENTION

The present invention relates, most generally, to semiconductor integrated circuit devices and to the methods for forming such devices. More particularly, the present invention is directed to decoupling capacitors formed over dielectric materials having a low dielectric constant.

BACKGROUND OF THE INVENTION

With the reduction in feature size and the ever-increasing speed of complementary metal-oxide-semiconductor (CMOS) logic circuitry, low-k dielectric/copper integration schemes are becoming increasingly more attractive. Complimentarily, the back-end-of-line (BEOL) processing aspects of advanced integration schemes are becoming a more integral part of the overall system. Devices and functions which were once part of the chip package may now be incorporated into the chip using BEOL processing, in response to cost and performance demands. One such device, which provides a cost and performance advantage and can be incorporated onto the semiconductor chip using BEOL processing, is a decoupling capacitor.

On-chip decoupling capacitors in semiconductor integrated circuit devices are needed to dampen power/ground bounce in high-speed digital systems. This power/ground bounce phenomenon results from resonance effects in the power supply circuitry. In addition, it is further understood that on-chip decoupling capacitors reduce or eliminate the effect of electromagnetic or radiative interference effects.

The present invention addresses the design of on-chip decoupling capacitors and their compatibility with the new low-k dielectric materials being used for advanced CMOS logic process flows. Low-k dielectric materials are simply dielectric materials having a dielectric constant (k) of less than about 4. Conventional methods for manufacturing semiconductor devices are incompatible with the use of low-k dielectric materials, unless additional masking layers, with associated increases in process complexity and costs, are used.

When forming a decoupling capacitor during BEOL processing in a low-k dielectric/copper integration scheme, several factors must be considered. Decoupling capacitors are vertically stacked with a lower electrode connected to a subjacent copper wire which is typically used as an interconnect. Low-k dielectric materials are used as the dielectric material in which damascene copper interconnect wires are formed because of the low parasitic capacitance between adjacent conductive wires, such as copper, when using a low-k dielectric material. Thus, the use of a low-k dielectric material in the damascene processing scheme allows for a maximum degree of integration because adjacent copper lines may be placed in close proximity to one another.

Complexity arises out of the fact that the low-k dielectric materials are typically carbon-based or includes carbon. Photoresist films commonly used as masking materials, in all patterning operations, are also carbon-based. Therefore, processes that are used to strip the photoresist materials also attack the exposed low-k dielectric materials. Poor selectivity in the etch processes used to etch the capacitor dielectric and tantalum nitride (TaN) film commonly used in capacitor electrodes creates additional problems. For example, during the etching process used to remove the capacitor dielectric from the lower TaN electrode, the lower TaN electrode may be attacked. Furthermore, during the etching process used to remove the lower TaN electrode from the low-k carbon-based dielectric material, the underlying low-k carbon-based dielectric material may be further attacked. After the etching process is complete, the stripping process used to remove the photoresist film severely attacks the underlying low-k dielectric and therefore degrades device integrity. Another issue using this integration scheme is copper-to-copper shorting. When the underlying structure includes damascene copper wires formed within a low-k dielectric material, shorting between the exposed copper wires may result during reactive ion etching (RIE) processes due to the back-sputtering of the exposed underlying copper metal.

In summary, there is a need to provide a structure and process for forming the structure which allow for the formation of vertically stacked decoupling capacitors over a damascene structure including tightly packed copper interconnect wires formed within a low-k dielectric material.

SUMMARY OF THE INVENTION

To address this and other needs, and in view of its purposes, the present invention provides a vertically stacked decoupling capacitor formed over a low-k dielectric material which may preferably include copper interconnect wires formed within the low-k dielectric material using damascene technology. The decoupling capacitor includes a hardmask film formed over the bottom electrode of the capacitor. The hardmask may be formed of aluminum or silicon according to exemplary embodiments. The present invention also provides a process for forming the same structure. Because of the inclusion of the hardmask, attack of the underlying low-k dielectric is suppressed during the etching and stripping process operations used to form the vertically stacked decoupling capacitor.

It is to be understood that both the foregoing general description and the following detailed description are exemplary, but are not restrictive, of the invention.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures, each of which is a cross-sectional view, collectively depicting the process sequence used to fabricate the device according to the present invention.

DETAILED DESCRIPTION OF THE INVENTION

The present invention is directed to a stacked capacitor having a hardmask formed between the capacitor dielectric and the lower electrode of the capacitor, and a method for forming the structure. Because of the novel hardmask, the stacked capacitor may be formed over a low-k dielectric material which otherwise would be subject to attack during the stripping processes conventionally used to remove carbon-based photoresist masking materials commonly used in the semiconductor manufacturing industry. Such masking materials are used in forming the stacked capacitor. Low-k dielectric materials are favored in the semiconductor manufacturing industry because they permit adjacent conductive wires formed using damascene processing techniques to be placed in close proximity to one another because of the resulting lowered parasitic capacitance between adjacent conductive wires formed within a low-k dielectric material.

Figure 1:
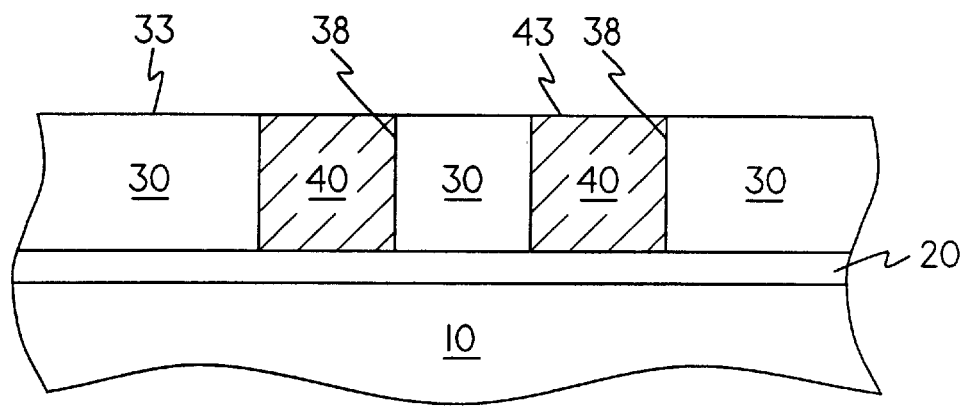
FIG. 1 shows conductive wires formed within a low-k dielectric material as in the prior art.

Now referring to the drawing, FIG. 1 is a cross-sectional view showing conductive wires formed within a low-k dielectric material as in the prior art. Conductive wires 40 are formed within trenches 38 which are formed within low-k dielectric material 30. Trenches 38 are formed, and conductive wires 40 are produced, according to conventional damascene processing. The term "damascene" is derived from the name of an ancient process used to fabricate a type of in-laid metal jewelry first seen in the city of Damascus. In the context of integrated circuits, damascene means formation of a patterned layer imbedded on and in another layer such that the top surfaces of the two layers are coplanar. Planarity is essential to the formation of fine-pitch interconnect levels because lithographic definition of fine features is achieved using high-resolution steppers having small depths of focus.

The damascene process is used in some aspects of semiconductor fabrication and involves inlaying a metal into a predefined pattern, typically in a dielectric layer. The process is performed by defining the desired pattern into a dielectric film; depositing metal over the entire surface by either physical vapor deposition, chemical vapor deposition, or evaporation; then polishing back the top surface in such a way that the top surface is planarized and the metal pattern is only located in the predefined regions of the dielectric layer. The damascene process is often used to manufacture metal wiring lines, including the bit-lines for a dynamic random access memory (DRAM) capacitor. The "dual damascene" process, in which conductive lines and stud via metal contacts are formed simultaneously, is described in U.S. Pat. No. 4,789,648 issued to Chow.

It should be understood that the generally rectangular cross-sectional shape of trenches 38 are intended to be exemplary only. In alternative embodiments, trenches 38 may be V-shaped grooves or tiered, dual damascene structures. In the preferred embodiment, conductive wires 40 may be copper (Cu) or an alloy of copper. In alternative embodiments, however, conductive wires 40 may be aluminum, nickel, tungsten, silver, gold, or their alloys. Using damascene processing technology, it can be seen that the structure is a planarized structure in which the upper surface 33 of low-k dielectric material 30 and the upper surface 43 of conductive wire 40 form a substantially planar surface.

Low-k dielectric material 30 may be formed over etch stop layer 20 using conventional methods. Etch stop layer 20 may be any material conventionally used in damascene processing which will form the bottom surface of damascene openings and therefore act as an etch stop layer. The underlying substrate 10 may be a semiconductor substrate such as a silicon wafer commonly used in the semiconductor manufacturing industry, or underlying substrate 10 may be a suitable film formed over such a substrate. Low-k dielectric material 30 has a dielectric constant, k, of less than 4 according to exemplary embodiments. Conventionally used silicon dioxide films typically have a dielectric constant, k, ranging from 4.0 to 4.2. Therefore, low-k dielectric material 30 is a dielectric material having a dielectric constant, k, that is less than the dielectric constant of conventionally formed oxides. According to various exemplary embodiments, low-k dielectric material 30 may be polyimide, various organic siloxane polymers, an organosilicate glass, or a carbon-doped silicate glass. According to other exemplary embodiments, low-k dielectric material 30 may be one of the following: various silicon dioxides having dielectric constants less than 4, a polyarylene ether, a hydrogen-doped silicate glass, a silsesquioxane glass, spin-on glass, fluorinated or non-fluorinated silicate glass, diamond-like amorphous carbon, nano-porous silicate, silsesquioxane polymer, or any other similar low dielectric constant material known in the art to be a useful dielectric material.

In alternative embodiments not shown in FIG. 1, conductive wire 40 may include a barrier layer film formed below the wire or alongside the wire structure within trench 38. In another alternative embodiment also not shown in FIG. 1, conductive wire 40 may additionally include an upper section formed of a barrier layer film. According to yet another alternative embodiment (not shown), low-k dielectric material 30 may be a composite film including an upper portion adjacent upper surface 33. The upper portion of the composite film forming such a low-k dielectric material 30 may be another low-k dielectric material such as a film used as a hardmask film in a previous patterning level. Examples of such low-k dielectric materials used as hardmask films may include any of the various low-k dielectric materials described previously.

In another alternative embodiment also not shown in FIG. 1, low-k dielectric material 30 may be a composite film consisting of a low-k dielectric film having one of various other hardmask films formed over the low-k dielectric film. The hardmask films may be formed of various materials and may have various dielectric constants. For example, the hardmask film may be a high-k silicon nitride film or a standard-k oxide film.

Figure 2:
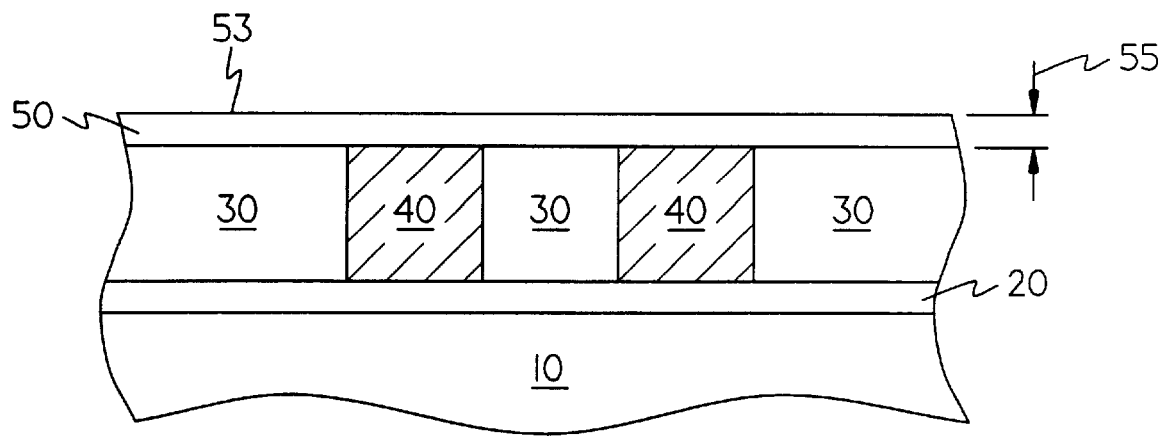
FIG. 2 shows a lower electrode film formed over the structure of FIG. 1.

Now turning to FIG. 2, a film 50 is formed over the structure shown in FIG. 1. According to the preferred embodiment, film 50 is a tantalum nitride (TaN) film which is to be used as a bottom electrode in the stacked capacitor of the present invention. According to various alternative embodiments, film 50 may be formed of suitable electrode materials other than TaN. Nevertheless, film 50 will be referred to as lower TaN electrode film 50. Lower TaN electrode film 50 has a top surface 53 and a thickness 55. In the exemplary embodiment, lower TaN electrode film 50 may be formed using a sputter deposition technique and has a thickness 55 within the range of 20–40 nanometers. Conventional sputtering techniques may be used to form lower TaN electrode film 50. Examples of other suitable electrode materials include Ta, W, TaSiN, Ti, TiN, TiSiN, and other suitable barrier layer films used in conjunction with copper, or in conjunction with another conductive film used to form conductive wire 40.

Figure 3:
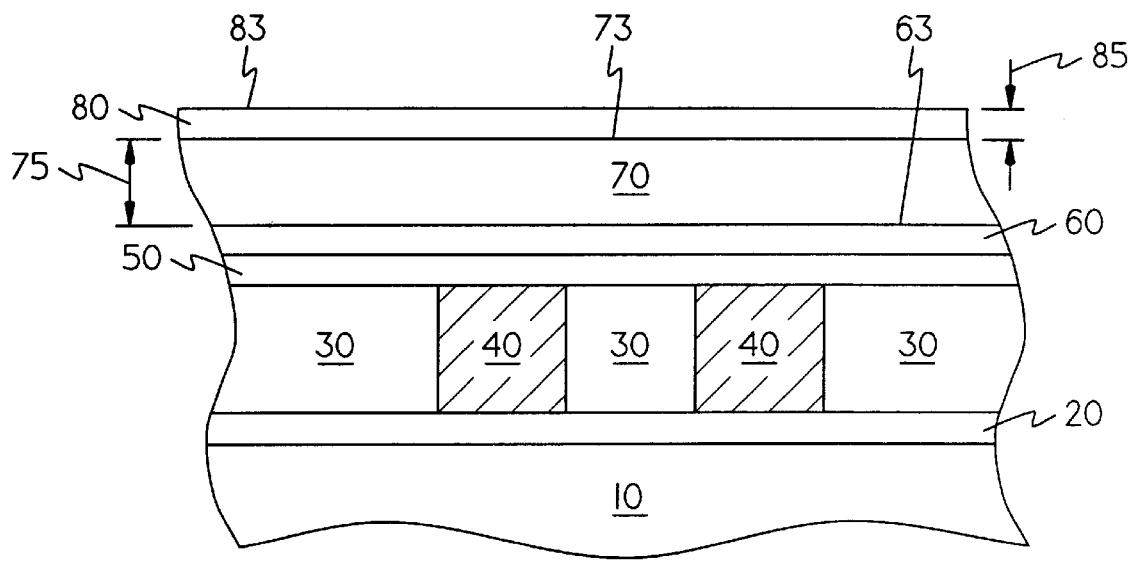
FIG. 3 shows the capacitor films, including the hardmask film, formed over the structure shown in FIG. 2.

FIG. 3 shows the structure shown in FIG. 2 after three additional films have been sequentially added. Over lower TaN electrode film 50, a hardmask film 60 is formed.

Hardmask film 60 may be formed using physical vapor deposition (PVD) and has a thickness of approximately 100 nanometers in the preferred embodiment. Other thicknesses and methods of formation may be used alternatively, however, for hardmask film 60. According to various exemplary embodiments, hardmask film 60 may be an aluminum film, a silicon film, or a copper-doped aluminum film. The PVD process used to form hardmask film 60 may be a conventional PVD process known in the art. Hardmask film 60 has a top surface 63.

A capacitor dielectric film 70 is formed over top surface 63 of hardmask film 60. Capacitor dielectric film 70 may be formed using plasma-enhanced chemical vapor deposition (PECVD), or other deposition techniques. Capacitor dielectric film 70 may be a silicon dioxide, or "oxide" film, or a silicon nitride film. Various other suitable dielectric films such as barium strontium titanate may be used alternatively. The thickness 75 of capacitor dielectric film 70 may be on the order of 1,000 nanometers in an exemplary embodiment, but other thicknesses may be used alternatively. Capacitor dielectric film 70 has a top surface 73.

An upper TaN electrode film 80 is formed over capacitor dielectric film 70. Upper TaN electrode film 80 may be formed according to the same methods used to form lower TaN electrode film 50. Upper TaN electrode film 80 has a thickness 85, which is greater than thickness 55 of lower TaN electrode film 50, and a top surface 83. In alternative embodiments, materials other than tantalum nitride may be used to form the upper electrode film., provided that such materials are the same material as the lower electrode film or provided that they do not etch at a significantly greater rate than the lower electrode film under the etching process conditions which will be used to etch the lower electrode film. Nonetheless, the upper electrode film will be referred to as upper TaN electrode film 80. Generally, thickness 85 of upper TaN electrode film 80 is twice as great as thickness 55 of lower TaN electrode film 50. According to an exemplary embodiment, thickness 85 ranges from 60–80 nanometers.

Figure 4:
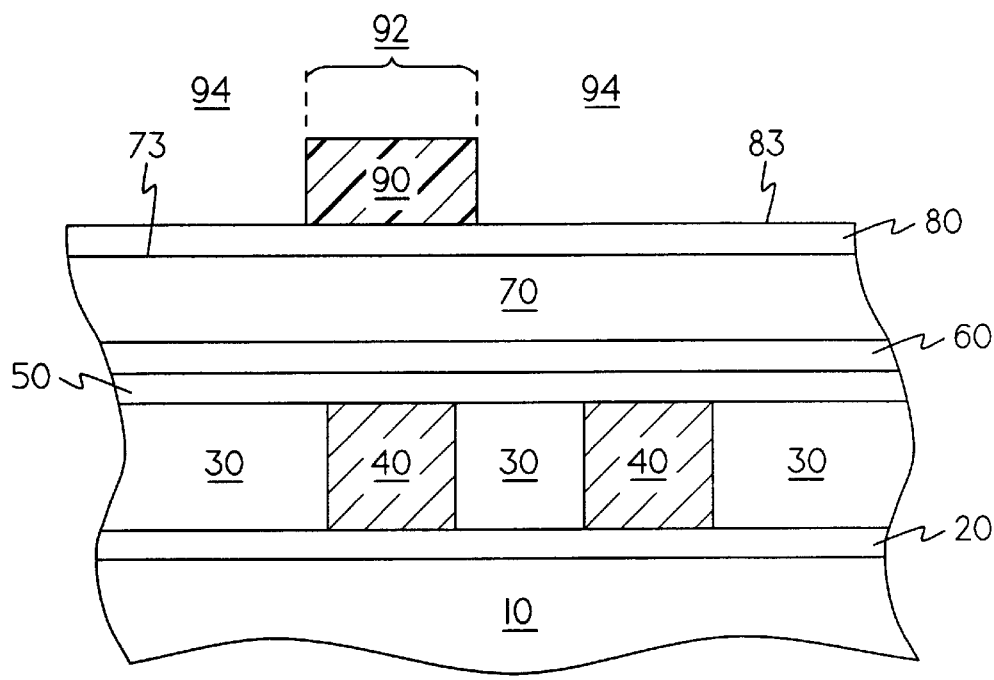
FIG. 4 shows a masking pattern formed over the structure shown in FIG. 3.

Now turning to FIG. 4, a masking pattern is formed over top surface 83 of upper TaN electrode film 80. A masking pattern may be formed with a photoresist film 90 using conventional patterning techniques such as those available in the art. After the masking pattern is formed and developed, the masking pattern has protected regions 92 and unprotected (or exposed) regions 94. Within protected regions 92, photoresist film 90 is intact. Conventional photoresist films 90 are carbon-based materials. Within unprotected regions 94, photoresist film 90 has been developed away. A capacitor is to be formed within protected region 92 and it can be seen that protected region 92 is formed over one of the conductive wires 40 which are formed within low-k dielectric material 30.

Figure 5:
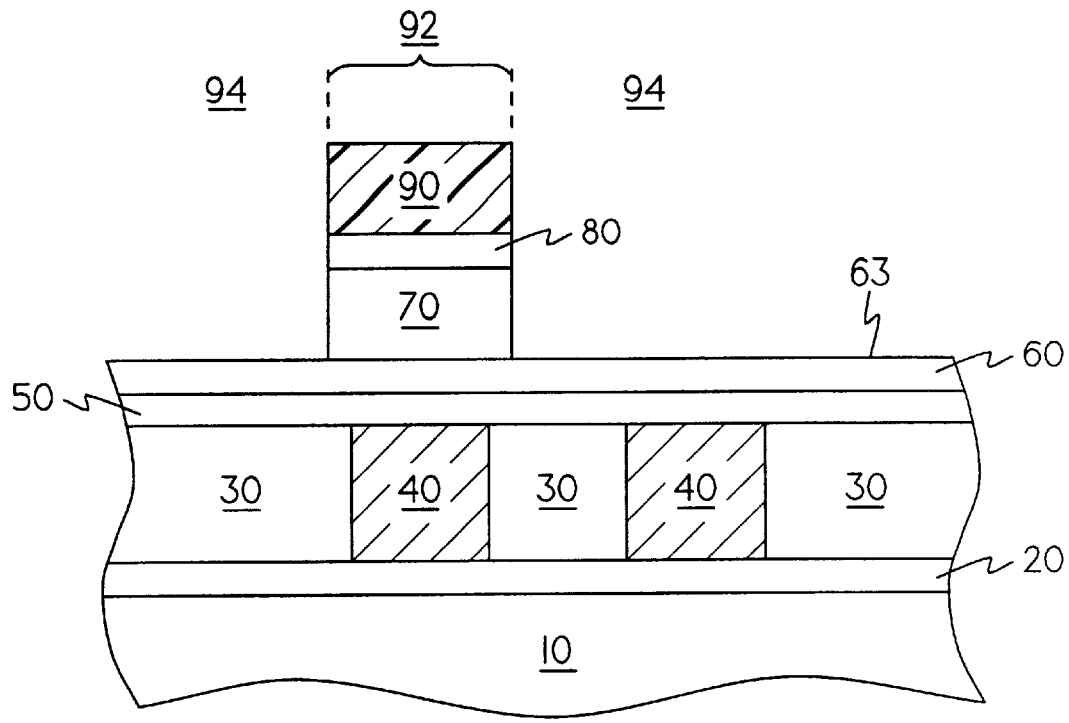
FIG. 5 shows the structure of FIG. 4 after unprotected regions of the upper electrode and capacitor dielectric have been removed.

With the masking pattern in place, successive layers are then removed from unprotected regions 94 by etching, to form the capacitor structure. FIG. 5 shows the structure after unprotected sections of upper TaN electrode film 80 and capacitor dielectric film 70, which lie in unprotected regions 94, have been removed by etching. The upper TaN electrode film 80 and capacitor dielectric film 70 etch processes are plasma-chemistry etch processes which use an etch chemistry including argon and $CF_4$. Conventional plasma etching methods, such as RIE plasma, may be used. In an exemplary embodiment, upper TaN electrode film 80 and capacitor dielectric film 70 are sequentially removed using a single, continuous etching process.

It can be seen that upper surface 63 of hardmask film 60 serves as the etch stop layer. The argon/$CF_4$ chemistry of the etch process and the etching conditions used render the etching process a selective process which does not appreciably etch hardmask film 60. Therefore, a significant amount of overetch time may be used to ensure that upper TaN electrode Film 80 and capacitor dielectric film 70 are completely removed from unprotected regions 94, without risk that hardmask film 60 will be attacked. Upper TaN electrode film 80 and capacitor dielectric film 70 remain intact within protected regions 92 beneath the photoresist film 90.

Figure 6:
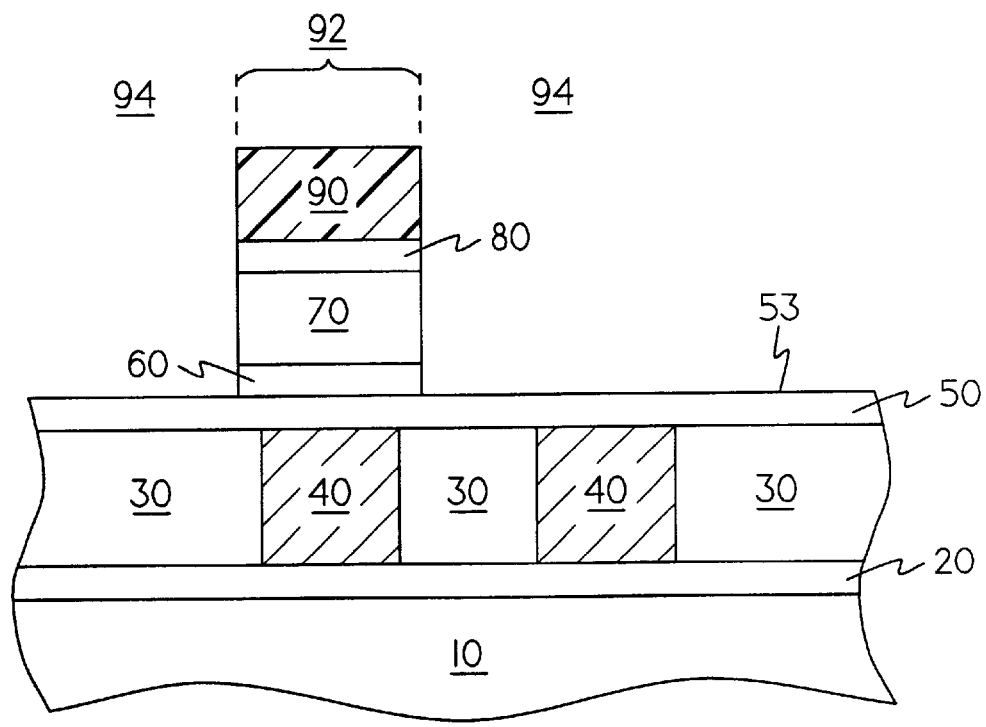
FIG. 6 shows the structure of FIG. 5 after unprotected regions of the hardmask film have been removed.

Now turning to FIG. 6, hardmask film 60 has been removed from unprotected regions 94. A plasma etching process using a chlorine chemistry, for example, to etch a hardmask film formed of silicon or aluminum, is applied. The plasma etching process applied to remove exposed portions of hardmask film 60 from unprotected regions 94 may be a conventional etching process. It is possible to apply an etching process that uses a power below 100 watts. The chlorine-based plasma etching process is selective to underlying lower TaN electrode layer 50 which serves as the etch stop layer during the hardmask etching process. A "selective" etching process is one in which the process conditions, including the chlorine, are chosen to ensure that lower TaN electrode film 50 is riot appreciably etched during the etching process used to remove hardmask film 60 from exposed regions 94. Consequently, a sufficient overetch time may be used to ensure the complete removal of hardmask film 60. In alternative embodiments, in which the lower electrode film is formed of a material other than TaN, the hardmask etching process conditions are chosen so that the hardmask etching process is selective and does not appreciably etch the alternative underlying lower electrode film.

Figure 7:
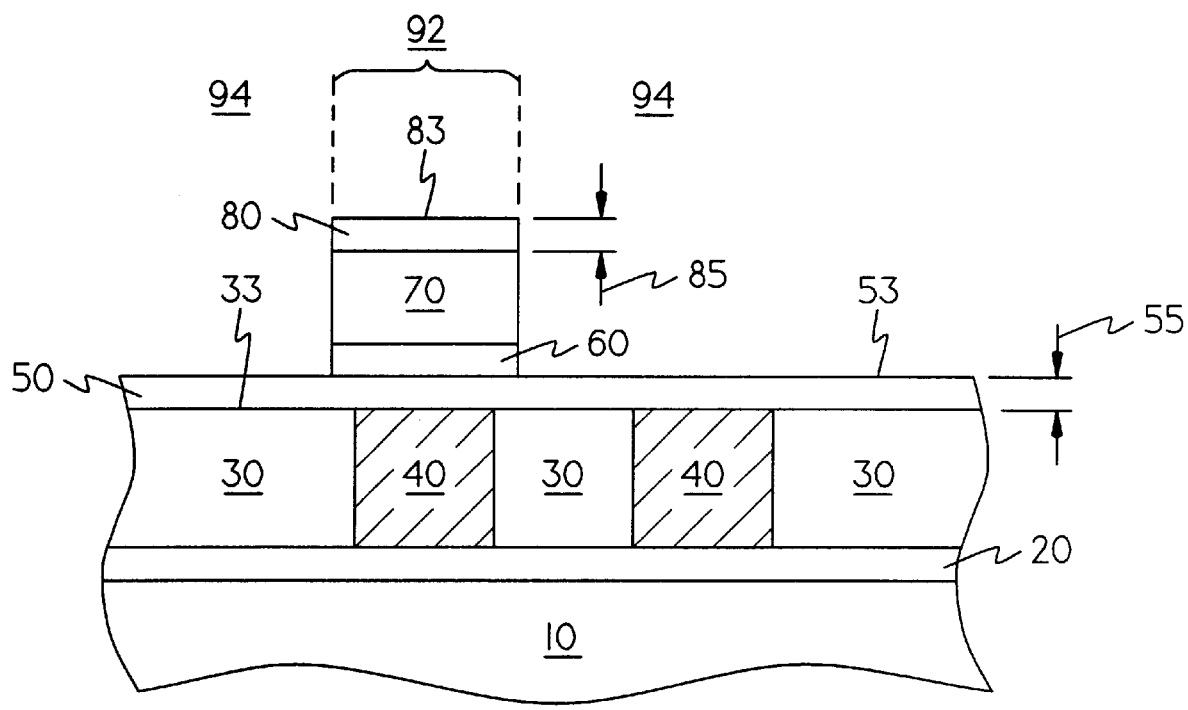
FIG. 7 shows the structure of FIG. 6 after the masking material has been removed.

FIG. 7 shows the structure illustrated in FIG. 6 after masking photoresist film 90 has been removed. The process used to strip or remove photoresist film 90 may be a stripping process conventionally available in the art. According to exemplary embodiments, this process may include oxidizing using a gaseous plasma, or it may include a wet chemical strip in dilute hydrofluoric acid or a dilute mixture of sulfuric acid and hydrogen peroxide. Each of the exemplary processes that may be used to strip photoresist film 90 would also attack exposed portions of low-k dielectric material 30. The presence of lower TaN electrode film 50 precludes exposure of upper surface 33 of low-k dielectric material 30, however, during the photoresist film removal process. Therefore, the presence of lower TaN electrode film 50 prevents the attack of low-k dielectric material 30 during the stripping process used to remove photoresist film 90. The removal of photoresist film 90 exposes upper surface 83 of upper TaN electrode film 80 within protected regions 92. It is an advantage of the present invention that photoresist film 90 can be safely removed using a process which does not attack underlying low-k dielectric material 30.

Figure 8:
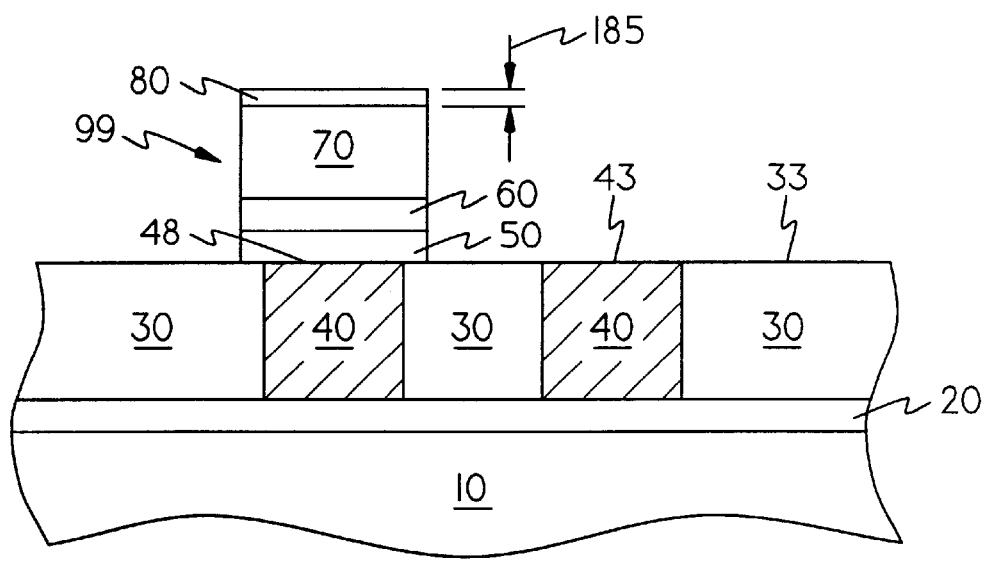
FIG. 8 shows an exemplary embodiment of the stacked capacitor device formed according to the present invention.

FIG. 8 shows the stacked capacitor structure 99 after lower TaN electrode film 50 has been removed from unprotected regions 94. Lower TaN electrode film 50 is removed using an etching process. The etching process may be a plasma etching process using argon and $CF_4$, as described in conjunction with the removal of originally exposed portions of upper TaN electrode film 80 and capacitor dielectric film 70, and as shown in FIG. 6. Because the original thickness 85 (as shown in FIG. 7) of upper TaN electrode film 80 is greater than the thickness 55 of lower TaN electrode film 50, the etching process is allowed to continue until lower TaN electrode film 50 is completely removed from exposed regions 94, thereby exposing upper surfaces 43 and 33 of conductive wire 40 and low-k dielectric film 30, respectively. Because thickness 85 of upper TaN electrode film 80 is chosen to be much greater than thickness 55 of lower TaN electrode film 50, portions of upper TaN electrode film 80 remain intact to form the upper capacitor electrode even after lower TaN electrode film 50 is completely removed by etching. In an alternative embodiment in which the electrode films are formed of materials other than TaN, the electrode films are chosen in conjunction with the process that will be used to etch the lower electrode film to ensure that the upper electrode film is not completely removed during the etch process used to etch the lower electrode film.

It is an aspect of the present invention that hardmask film 60, shown in FIG. 5, renders unnecessary removal of the sequence of films including upper TaN electrode film 80, capacitor dielectric film 70, and lower TaN electrode film 50 in one continuous process. Therefore, during the etching process used to remove lower TaN electrode film 50, only a single, relatively thin film must be removed and the effects of non-uniformities in film thickness and within the etching process are minimized.

This advantage allows the etching process to be tailored, and the overetch percentage to be minimized, such that the etching process can be confidently stopped after the complete removal of lower TaN electrode film 50 without requiring a large overetch percentage. This advantage ensures, in turn, that upper TaN electrode film 80, which is exposed in protected region 92 during the etching of lower TaN electrode film 50, will not be completely removed by etching. The resulting thickness 185 of upper TaN electrode film 80 within protected region 92 will be less than original thickness 85 as shown in FIG. 7. The reduction in film thickness will typically correspond to thickness 55 of lower TaN electrode film 50 which is completely removed by etching. In an alternative embodiment, the thickness of the upper electrode film may not be diminished appreciably.

As formed, stacked capacitor 99 includes upper TaN electrode film 80, capacitor dielectric material 70, hardmask film 60, and lower TaN electrode film 50. Stacked capacitor 99 is formed over a structure including conductive wires 40 formed within low-k dielectric material 30. Stacked capacitor 99 contacts conductive wire 40 in a contact region 48. In this manner, stacked capacitor 99 may be interconnected to other features of the semiconductor device being formed on substrate 10. It should be understood that the structure shown in FIG. 8 is exemplary only, and that the stacked capacitor may be alternatively formed over other underlying structures.

An aspect of the present invention is the advantage that it provides for a semiconductor device manufactured using a particular integration scheme. Such a scheme has a low-k dielectric material which is subject to attack by the processes conventionally used to strip carbon-based photoresist masking materials and uses an etch process for the removal of electrode and capacitor dielectric films which has a poor selectivity and may attack underlying features. In a structure not including the hardmask film of the present invention, a composite film including an upper TaN electrode film, a capacitor dielectric film, and a low TaN electrode film will be etched according to a single, continuous, conventional etching process which may include argon and $CF_4$ in the etching chemistry.

Because of non-uniformities within the relatively thick composite film thickness and within the etching process itself, a large percentage of overetch must be used when a single continuous process is used to remove the stack of films having a relatively high composite film thickness. This overetch increases the etch attack of the underlying substrate, particularly the low-k dielectric material having portions which may be exposed during a significant portion of the overetch. The absence of a hardmask film also prevents the removal of the photoresist film during the sequence used to remove the composite film, because such removal may result in the complete removal of the upper electrode film as a high overetch percentage will be necessary to ensure complete removal of the lower electrode film. The hardmask film and process sequence of the present invention provide for a sufficient overetch time to be used to sufficiently clear all of the upper TaN electrode film and capacitor dielectric film and also for the photoresist film to be removed, without risk of attacking the underlying low-k dielectric material.

Furthermore, using conventional processing techniques, the underlying structure including the low-k dielectric material and the conductive wire will be exposed to RIE processes for a greater time. During this time, the RIE may include a physical ion milling component which may effectuate the back-sputtering of the conductive material from the conductive wire. Such back-sputtering may result in shorting between adjacent conductive wires, and may also result in shorting between the upper and lower electrodes of the capacitor, thereby destroying the capacitor.

The foregoing description of exemplary embodiments of the invention has been presented for the purposes of illustrating and describing the main points of the concepts of the invention. The present invention is not limited, however, to those embodiments. For example, other materials may be used to form the electrodes of the stacked capacitor of the present invention. Likewise, the underlying structure over which the stacked capacitor is formed may be varied and may not include a low-k dielectric material, according to alternative embodiments.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A semiconductor device comprising a vertically integrated capacitor having:
   (a) a semiconductor substrate;
   (b) a low dielectric constant dielectric material, with a dielectric constant less than 4.0, formed over said semiconductor substrate;
   (c) a bottom electrode formed over said low dielectric constant dielectric material;
   (d) a hardmask film comprising aluminum and being formed over said bottom electrode;
   (e) a capacitor dielectric formed over said hardmask film; and
   (f) a top electrode formed over said capacitor dielectric.

2. The semiconductor device as in claim 1, further comprising a conductive wire formed within said low dielectric constant dielectric material, said bottom electrode formed over said conductive wire.

3. The semiconductor device as in claim 1, wherein each of said bottom electrode and said top electrode comprises TaN.

4. The semiconductor device as in claim 1, wherein each of said bottom electrode and said top electrode comprises one of Ta, W, TaSiN, Ti, TiN, and TiSiN.

5. The semiconductor device as in claim 1, wherein said low dielectric constant dielectric material is formed of a material chosen from the group consisting of polyimide, an organic siloxane polymer, an organosilicate glass, a carbon-doped silicate glass, a silicon dioxide, a polyarlyene ether, a hydrogen-doped silicate glass, a silsesquioxane glass, a spin-on glass, fluorinated silicate glass, non-fluorinated silicate glass, diamond-like amorphous carbon, nano-porous silicate, and a silsesquioxane polymer.

6. The semiconductor device as in claim 2, wherein said conductive wire comprises one of a copper wire, an aluminum wire, and a tungsten wire.

* * * * *